(12) United States Patent
Huang

(10) Patent No.: US 7,928,509 B2
(45) Date of Patent: Apr. 19, 2011

(54) INTEGRATED JFET AND SCHOTTKY DIODE

(75) Inventor: Chih-Feng Huang, Jhubel (TW)

(73) Assignee: Richtek Technology Corporation, Hsin-Chu (TW)

( * ) Notice: Subject to any disclaimer, the term of this patent is extended or adjusted under 35 U.S.C. 154(b) by 71 days.

(21) Appl. No.: 12/470,391

(22) Filed: May 21, 2009

(65) Prior Publication Data
US 2010/0295101 A1     Nov. 25, 2010

(51) Int. Cl.
*H01L 27/12*     (2006.01)

(52) U.S. Cl. .. 257/348; 257/392; 257/402; 257/E27.061

(58) Field of Classification Search .............. 257/343
See application file for complete search history.

(56) References Cited

U.S. PATENT DOCUMENTS

| | | | |
|---|---|---|---|
| 6,784,489 B1 * | 8/2004 | Menegoli | 257/343 |
| 7,608,907 B2 * | 10/2009 | Mallikarjunaswamy | 257/476 |
| 2006/0145185 A1 * | 7/2006 | Mallikarjunaswamy | 257/133 |
| 2007/0298559 A1 * | 12/2007 | Brar et al. | 438/197 |

* cited by examiner

*Primary Examiner* — Ajay K Arora
(74) *Attorney, Agent, or Firm* — Tung & Associates

(57) ABSTRACT

The present invention discloses an integrated junction field effect transistor (JFET) and Schottky diode, comprising a depletion mode JFET which includes a source, a drain and a gate, wherein the drain is not provided with an ohmic contact such that it forms a Schottky diode.

7 Claims, 3 Drawing Sheets

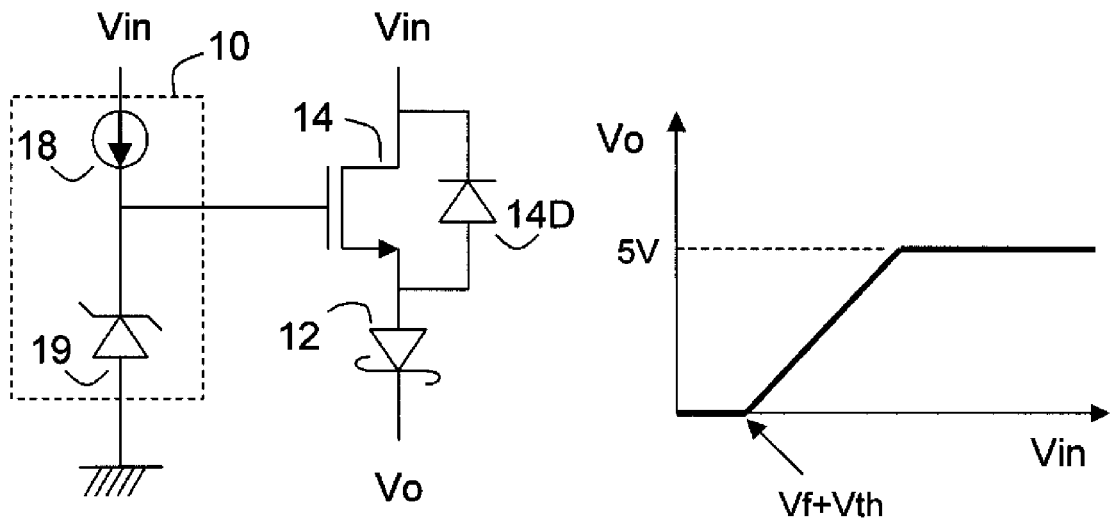
Fig. 3A
(Prior Art)
Fig. 3B
(Prior Art)
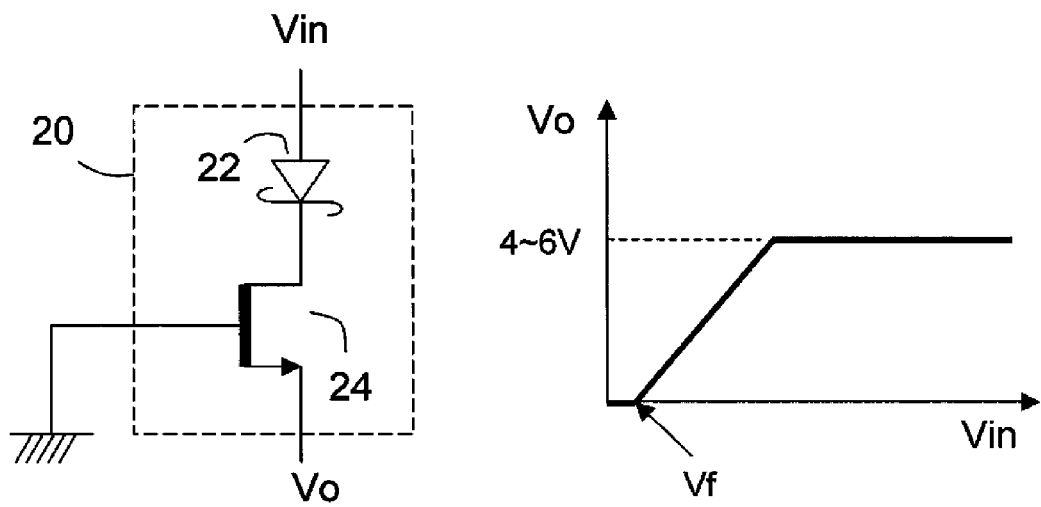
Fig. 4A
Fig. 4B

INTEGRATED JFET AND SCHOTTKY DIODE

FIELD OF INVENTION

The present invention relates to an integrated device of a junction field effect transistor (JFET) and a Schottky diode.

DESCRIPTION OF RELATED ART

A power management circuit often requires a power switch device formed by a stand-alone NMOS transistor and a stand-alone Schottky diode. Referring to FIG. 1, an NMOS transistor 14 and a Schottky diode 12 are connected in series to form the power switch device, wherein the NMOS transistor 14 includes a parasitic diode 14D. A control circuit 10 controls the gate of the NMOS transistor 14 to convert an input voltage Vin to an output voltage Vo. The Schottky diode 12 is provided for blocking current flowing reversely via the parasitic diode 14D when the output voltage Vo is higher than the input voltage Vin, so that the reverse current does not occur to damage the input voltage Vin. FIG. 2 illustrates another prior art circuit, in which a depletion mode NMOS transistor 16 and a Schottky diode 12 are connected in series to form the power switch device. The Schottky diode 12 is provided for blocking current flowing reversely via the parasitic diode 16D as well.

Please refer to FIGS. 3A and 3B, with the prior art of FIG. 1 as an example. The control circuit 10 includes a current source 18 and a zener diode 19. The input/output voltage relationship intended to achieve by the power switch device is shown for example as FIG. 3B. When the input voltage Vin is higher than the sum of a threshold voltage Vth of the NMOS transistor 14 and a forward bias voltage Vf of the Schottky diode 12, power can be transmitted from the input voltage Vin to the output voltage Vo. Yet, the gate of the NMOS transistor 14 is controlled by the zener diode 19; when the input voltage Vin is high than a breakdown voltage (5V) of the zener diode 19, the zener diode 19 is reversely turned on, so that the gate voltage of the NMOS transistor 14 (and thus the output voltage Vo) is maintained approximately at 5V.

The drawbacks of the above mentioned prior art are that the stand-alone NMOS transistor and the stand-alone Schottky diode occupy a large amount of circuit area, and it is required for the control circuit 10 to use the zener diode 19, increasing the overall cost of the entire circuitry.

Accordingly, in view of the foregoing problem of the prior art, the present invention provides an integrated device of a JFET and a Schottky diode to reduce the circuit area of the power switch device and to simplify the circuit structure of the control circuit 10.

SUMMARY OF THE INVENTION

An objective of the present invention is to provide an integrated device of a JFET and a Schottky diode.

In order to achieve the foregoing objective, in one perspective, the present invention provides an integrated device of a JFET and a Schottky diode, comprising: a depletion mode JFET which includes a source, a drain and a gate, wherein the drain is not provided with an ohmic contact such that it forms a Schottky diode.

The foregoing integrated device of a JFET and a Schottky diode can be a planar type device or a vertical type device.

In another perspective, the present invention provides an integrated device of a JFET and a Schottky diode, comprising: a substrate with a first conduction type; a first well region with a second conduction type in the substrate; a second well region with the first conduction type in the first well region; a first heavily doped region with the second conduction type in the first well region; and a second heavily doped region with the first conduction type in a second well region; wherein a depletion mode JFET is formed by the substrate, the first well region, and the second well region; wherein the first heavily doped region provides an ohmic contact for a source of the depletion mode JFET, and the second heavily doped region provides an ohmic contact for a gate of the depletion mode JFET; and wherein a drain of the depletion mode JEFT is not provided with an ohmic contact of the first conduction type such that the drain forms a Schottky diode.

The foregoing integrated device preferably further comprises at least a third doped region with the first conduction type at a position near the Schottky diode to control a reverse leakage current of the Schottky diode.

In yet another perspective, the present invention provides an integrated device of a JFET and a Schottky diode comprising: a substrate with a first conduction type; and two first well regions with a second conduction type in the substrate; wherein a vertical depletion mode JFET is formed by the substrate and the two first well regions, a front side of the substrate being a drain of the depletion mode JFET, a back side of the substrate being a source of the depletion mode JFET, and the two first well regions being a gate of the depletion mode JFET; in which the drain of the depletion mode JFET is not provided with an ohmic contact of the first conduction type such that the drain forms a Schottky diode.

The above mentioned integrated device preferably further comprises at least a doped region of the second conduction type to control the reverse leakage current of the Schottky diode.

The objectives, technical details, features, and effects of the present invention will be better understood with regard to the detailed description of the embodiments below, with reference to the drawings.

BRIEF DESCRIPTION OF THE DRAWINGS

FIG. 3A and FIG. 3B illustrate an application of the prior art.

FIG. 4A and FIG. 4B show an embodiment of the present invention and its application.

DESCRIPTION OF THE PREFERRED EMBODIMENTS

The drawings as referred to throughout the description of the present invention are for illustration only, but not drawn according to actual scale.

Please refer to FIGS. 4A and 4B, which show an embodiment of the present invention by way of a circuit diagram. As shown in the figure, this embodiment provides an integrated power switch device 20 including a Schottky diode 22 and a junction NMOS transistor 24. The junction NMOS transistor 24 is a depletion mode transistor having a gate coupled to ground and thus a complicated control circuit 10 is not required. The relationship between the input voltage Vin and the output voltage Vo is shown in FIG. 4B. When the input voltage Vin is higher than a forward bias voltage Vf of the Schottky diode 22, power can be transmitted from the input Vin to the output Vo. Yet, due to a current limiting characteristic of the depletion mode JFET itself, the output voltage Vo maintains approximately at 4-6V (this value is for illustrative purpose only; it can be modified according to the requirement by a next-stage circuit).

Figure 1:
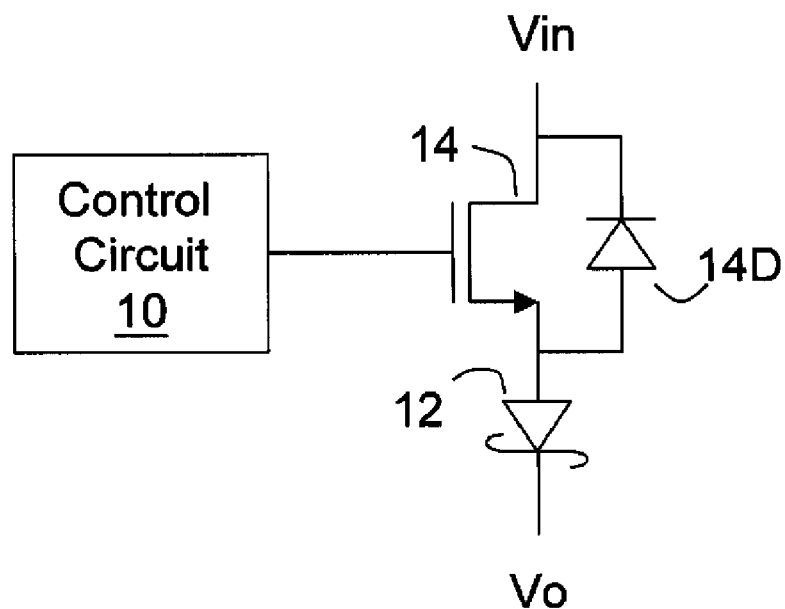
FIG. 1 and FIG. 2 respectively show the two prior art power switch devices, both of which include a stand-alone NMOS transistor and a stand-alone Schottky diode.
Figure 2:
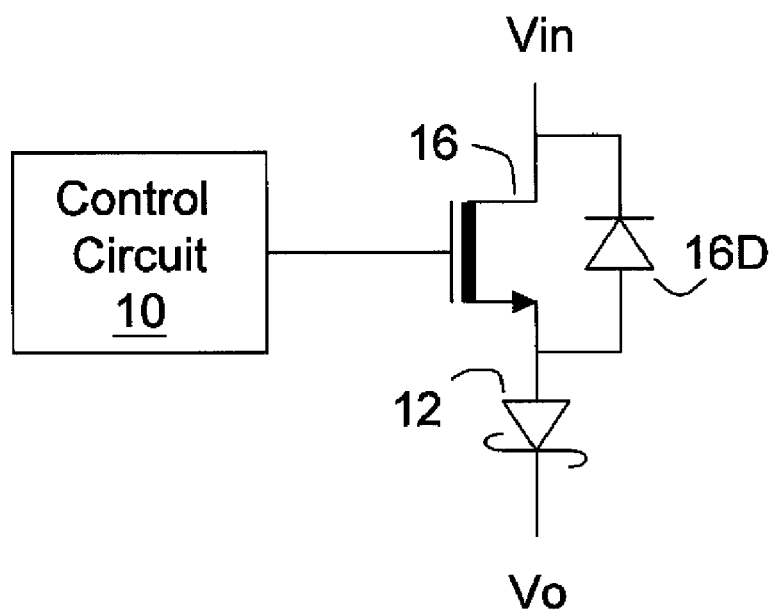
Figure 5:
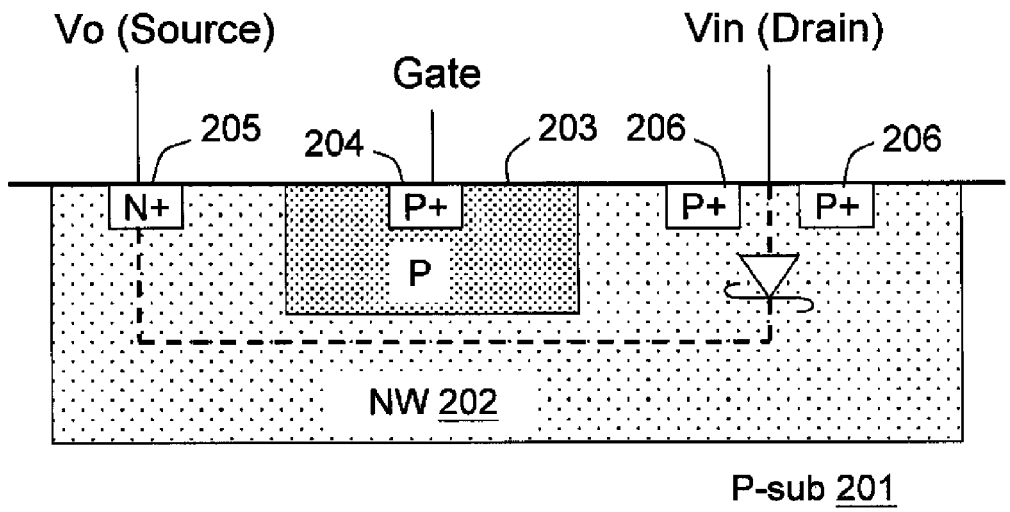
FIG. 5 shows an example of the present invention embodied by a semiconductor structure.

FIG. 5 shows an example as to how the present invention can be embodied by semiconductor. As shown in the drawing, an N type well region 202 is formed on a P type substrate 201, and a P type doped region 203 is provided in the N type well region 202, such that the depletion mode JFET 24 as shown in FIG. 4A is formed. Preferably, a P+ heavily doped region 204 is provided in the P type doped region 203, and an N+ heavily doped region 205 is provided in the N type region 202, as ohmic contacts for the gate and source of the depletion mode JFET respectively. However, at the right side of the N type well region 202 which is the drain region, an N+ heavily doped region is not provided. Because an ohmic contact is not provided here, the conduction barrier is higher at this position; thus, it is equivalent to providing a Schottky diode connected in series with the drain of the JFET 24. In a preferred embodiment, a P+ heavily doped region 206 can be further provided at a position near the Schottky diode in the N type well region 202 for controlling a reverse leakage current of the Schottky diode.

As shown in FIG. 5, the circuit area occupied by the present invention is comparable to the circuit area of a single depletion mode JFET. Moreover, it shows by comparing FIG. 3B with FIG. 4B that the present invention can replace the prior art, while a complicated control circuit is not required. Thus, the present invention is considerably superior to the prior art.

Figure 6:
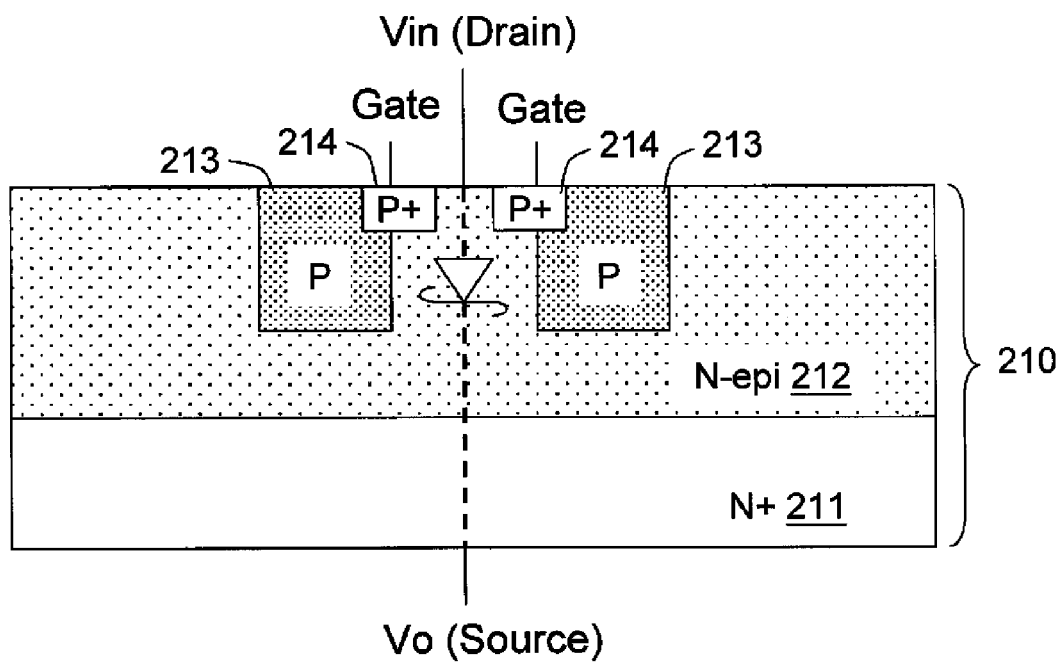
FIG. 6 shows another example of the present invention embodied by a semiconductor structure.

FIG. 6 shows another embodiment of the present invention, wherein the depletion mode JFET is a vertical type device. As shown in the figure, two P type well regions 213 are formed on the N type substrate 210, such that a vertical type depletion mode JFET is formed having gates formed by the two P type well regions 213, and a drain and a source formed by the front side and back side of the substrate respectively. Preferably, in order to provide a better contact resistance for the source, the N type substrate 210 includes an N+ body 211 with a higher doping concentration and an N type epitaxially grown region 212. Similarly to the previous embodiment, an N+ heavily doped region is not provided at the drain region, causing a higher conduction barrier such that a Schottky diode is formed in series connection with the drain of the vertical type JFET. Likewise, in order to control the reverse leakage current of the Schottky diode, one or more P+ heavily doped regions 214 can be further provided at positions near the Schottky diode on the surface of the N type substrate 210; such P+ doped regions 214 also provide ohmic contact for the gates. If the P+ doped regions 214 are not provided, the gate terminals shown in the drawing should be connected to the P type well regions 213.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. In view of the foregoing, the spirit of the present invention should cover all such and other modifications and variations, which should be interpreted to fall within the scope of the following claims and their equivalents.

What is claimed is:

1. An integrated device of a JFET and a Schottky diode, comprising:
    a substrate with a first conduction type;
    a first well region with a second conduction type in the substrate;
    a second well region with the first conduction type in the first well region;
    a first heavily doped region with the second conduction type in the first well region; and
    a second heavily doped region with the first conduction type in a second well region;
    wherein a depletion mode JFET is formed by the substrate, the first well region, and the second well region; wherein the first heavily doped region provides an ohmic contact for a source of the depletion mode JFET, and the second heavily doped region provides an ohmic contact for a gate of the depletion mode JFET; and wherein a drain of the depletion mode JFET is not provided with an ohmic contact and instead, the drain contact is a rectifying contact that forms a Schottky diode.

2. The integrated device of claim 1, wherein at least a third doped region with the first conduction type is provided at a position near the Schottky diode in the first well region.

3. The integrated device of claim 1, wherein the first conduction type is P-type and the second conduction type is N-type.

4. An integrated device of a JFET and a Schottky diode, comprising:
    a substrate with a first conduction type; and
    two first well regions with a second conduction type in the substrate;
    wherein a vertical depletion mode JFET is formed by the substrate and the two first well regions, a front side of the substrate being a drain of the depletion mode JFET, a back side of the substrate being a source of the depletion mode JFET, and the two first well regions being a gate of the depletion mode JFET; in which the drain of the depletion mode JFET is not provided with an ohmic contact and instead, the drain contact is a rectifying contact that forms a Schottky diode.

5. The integrated device of claim 4, wherein at least one doped region of the second conduction type is provided at a position near the Schottky diode in the first well region.

6. The integrated device of claim 4, wherein the substrate includes a body with a higher doping concentration and an epitaxially grown region with a lower doping concentration above the body.

7. The integrated device of claim 4, wherein the first conduction type is N-type and the second conduction type is P-type.

* * * * *